May 25, 1965 R. J. EHRET 3,185,933
CLASS B AMPLIFIER CIRCUIT
Filed Nov. 20, 1961
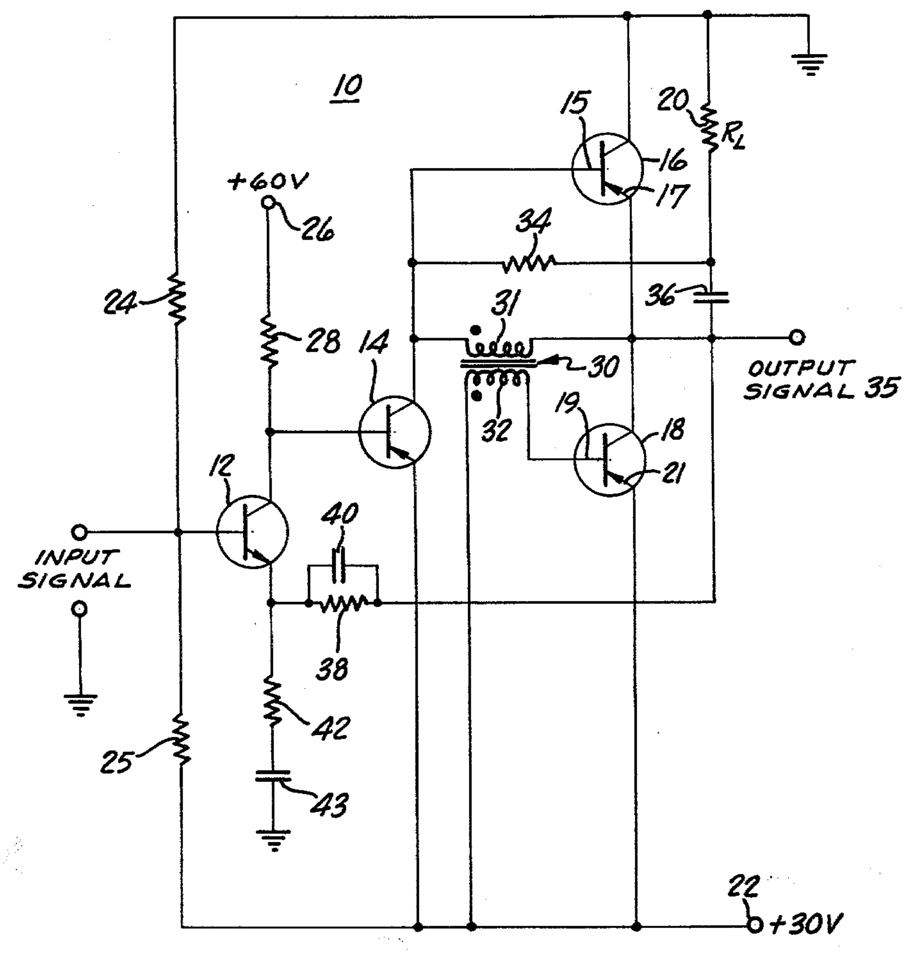
ROBERT J. EHRET
INVENTOR.
BY Nathan N. Kallman
ATTORNEY United States Patent Office 3,185,933
Patented May 25, 1965

3,185,933

CLASS B AMPLIFIER CIRCUIT

Robert J. Ehret, Los Altos, Calif., assignor to Ampex Corporation, Redwood City, Calif., a corporation of California Filed Nov. 20, 1961, Ser. No. 153,509
5 Claims. (Cl. 330—14)

This invention relates to signal amplifying circuits and more particularly to such a circuit utilizing a pair of transistors in a quasi-complementary configuration for Class B operation.

In an endeavor to provide suitable high fidelity amplification of signals in the audio range beginning near zero frequency, a great many circuit variations have been developed. With the development of the transistor, effort has concentrated on circuits employing transistors rather than vacuum tubes in order to achieve more efficient operation and more compact design with increased reliability. A number of such circuits utilize transistors in amplifiers under Class B operation in order to achieve increased output with suitable fidelity. Feedbacks are provided and various circuit innovations have been employed in order to achieve gain stabilization and limited signal distortion.

A considerable proportion of those Class B transistor amplifiers which are known utilize output transformers to couple the load to the amplifier. In consequence, phase shifts which are inherent in the transformers, particularly when they are driven at significant power levels, limit the amount of usable feedback and the range over which it may be applied.

In order to avoid the limitation which is inherent in such transformer-coupled Class B amplifier circuits while still employing transistors in the amplifying stages, circuits have been developed known as complementary symmetry, or simply complementary amplifiers employing a pair of opposite conductivity type transistors in a push-pull arrangement to achieve Class B operation without the need for transformers. However, such circuits in general depend upon a rather critical control of the bias levels of the respective transistors in the complementary configuration. The complementary transistor amplifier does not require an output transformer and therefore is free from the problems ordinarily associated with such a component. However, at best the complementary transistor amplifier circuit is subject to a certain amount of cross-over distortion and, furthermore, at this time no completely satisfactory method of driving such a circuit is known. In addition those complementary amplifier circuits which are known are subject to temperature instability because of the relatively large D.C. input impedance required to maintain suitable bias control. A further disadvantage is that two different types of transistors are required, this making it more difficult to match the characteristics in order to achieve truly symmetrical Class B operation.

It is therefore an object of this invention to provide an improved Class B amplifier employing transistors.

It is an object of this invention to provide a transistorized Class B amplifier which is relatively insensitive to temperature variations.

It is another object of this invention to provide a transistorized Class B amplifier utilizing a driving transformer in a circuit which is free from the limitations ordinarily found in transformer-coupled amplifier circuits.

A further object of the invention is a high fidelity amplifier circuit utilizing transistors in Class B operation and providing a feedback loop which is substantially free of phase shift limitations.

Briefly in accordance with the invention a circuit is provided utilizing a pair of output transistors connected to a load impedance in a quasi-complementary configuration. By quasi-complementary is meant a circuit utilizing two transistors of like conductivity type in push-pull operation and having a common connection to an output terminal, thus obviating the need for an output transformer. Input signals are amplified through a pair of cascaded transistors of opposite conductivity type before being applied to drive the quasi-complementary output transistor pair. Signals are applied to the respective inputs of the output transistors by virtue of a transformer having a 1:1 turns ratio and connected between the second cascaded transistor stage and the output pair. The secondary winding of the transformer is connected directly to the base of one of the output transistors. The base of the other output transistor is, however, connected directly to the output of the driving amplifier stage. The primary winding of the transformer is connected in circuit between the base and emitter electrodes of the second output transistor and also between the output of the driving amplifier stage and the load.

In accordance with the invention the circuit is designed so that the input voltage of the pair of output transistors depends upon the load current. At low signal levels, the driving amplifier stage supplies the load directly in series with the primary winding of the transformer. As more load current is required, there is developed an increased voltage drop across the transformer primary winding which automatically inceases the drive to the respective quasi-complementary output transistors. By virtue of the 1:1 turns ratio of the transformer the output transistors are driven as symmetrical amplifier stages, because the signal voltage developed between emitter and base of the first output transistor across the primary winding of the transformer is automatically applied between emitter and base of the second output transistor from the secondary winding of the transformer. The 1:1 turns ratio and the fact that the primary of the transformer is not required to carry all of the collector current flowing in the transistor of the driver stage permits the use of a transformer which is compact in size, light in weight and of a particular design which substantially extends the high frequency response and limits the phase shift distortion thereof. In accordance with this aspect of the invention, the circuit may utilize a transformer having a bifilar construction which virtually eliminates leakage inductance between the primary and secondary windings. In addition, the current and voltage of the respective transformer windings are maintained at very low levels which are just sufficient to supply the drive required between the base and emitter electrodes of the output transistors, with the results that extremely linear operation of the transformer is achieved and the unwanted distortion effects formerly present in transformer-coupled amplifiers are substantially eliminated. Finally, a substantial independence of the formerly encountered adverse effects resulting from ambient temperature variations is achieved by virtue of the fact that an extremely low resistance to direct current is provided between base and emitter of the respective output transistors, since the only impedance to direct current existing in the respective paths between base and emitter of the output transistors in the circuit of the invention are the corresponding transformer windings which have negligible resistance.

In addition to the above described advantages provided in the circuit of the invention through the use of the 1:1 transformer to drive the output transistors thereof, the circuit also provides a desirable gain stabilization of the overall amplifier by virtue of a feedback connection between the circuit output terminal and the input transistor of the first stage. This feedback path completes the loop for D.C. as well as A.C. signals and the output transistors are matched along with the resistors present at the amplifier input so that a unity gain at D.C. or zero frequency is provided by the amplifier.

A better understanding of the invention may be gained from the following detailed description taken in conjunction with the drawing, in which the single figure is a schematic representation of one particular arrangement of the invention.

In the circuit representation in accordance with the invention depicted in the drawing, an ampifier circuit 10 is shown comprising an input transistor 12 connected in cascade to a driving transistor 14. Information signals that are to be amplified, are applied through the driving transistor 14 to the input or base electrodes of respective quasi-complementary output transistors 16 and 18 which are arranged to drive a load 20 represented by a resistance $R_L$. As will be seen, the output transistors 16 and 18 are arranged to conduct alternately in response to driving signals from the driving transistor 14. Connected in a biasing network between a reference point of potential, such as ground, and the positive terminal 22 of a 30 volt supply is a pair of resistors 24 and 25, to the midpoint of which are connected the input electrode or base of the transistor 12 and the input terminal of the amplifier 10. The collector electrode of the input transistor 12 is connected to a positive terminal 26 of a 60 volt supply through a load resistor 28. The collector electrode of the driving transistor 14 is connected directly to the input or base electrode 15 of the first output transistor 16 and also to one end of the primary winding 31 of a transformer 30 which is connected between the base electrode 15 and the emitter electrode 17 of the first output transistor 16. The secondary winding 32 of the transformer 30 is connected directly between the base electrode 19 and the emitter electrode 21 of the second output transistor 18. However the respective voltages present at the windings 31 and 32, as indicated by the dots shown adjacent thereto, are arranged to be of opposite polarity as applied to the respective base electrodes 15 and 19; that is, when one base electrode such as 15 is driven positive, the other base electrode such as 19 is driven negative so that the output transistors 16 and 18 conduct in alternate fashion. A D.C. path from the collector electrode of the driving transistor 14 is completed via a resistor 34 which is connected to the load resistor 20. A coupling capacitor 36 is connected between the load resistor 20 and the midpoint of the output transistors 16 and 18 which constitutes an output terminal 35. A feedback path between the same output terminal 35 and the emitter electrode of the input transistor 12 includes a resistor 38 and a capacitor 40 connected in parallel. A low frequency compensation network comprising a resistor 42 and a capacitor 43 in series is connected between the emitter electrode of the input transistor 12 and ground.

In the operation of the circuit of the invention, signals are applied to the input terminal of the amplifier circuit 10 and are amplified through the input transistor 12 and the driving transistor 14, both of which operate as common emitter stages. In one specific arrangement of the invention the resistors 24 and 25 are of equal resistance value and the output transistors 16 and 18 are also matched so that the quiescent potential of the output terminal 35 connected to the emitter electrode 17 is a substantially fixed voltage, for example approximately 15 volts, which is midway between ground and the value of the positive supply terminal 22, driving the output transistors. Since in the absence of an input signal the input and output potentials are the same, the overall amplifier can be seen to have unity gain at D.C. The A.C. gain for the amplifier 10 may be determined by the ratio of the resistor 42 to the resistor 38.

Under zero-signal conditions the voltage across both primary and secondary windings 31 and 32 respectively of the transformer 30 is zero so that the output transistors 16 and 18 are conducting equally. However the application of an input signal to the amplifier 10 develops a voltage change at the collector electrode of the driving transistor 14 which is applied directly to the base electrode 15 of the first output transistor 16 and, by virtue of the 1:1 turns ratio in the transformer 30, is also applied to the base electrode 19 of the second output transistor 18. However, as already explained, the applied voltage changes at the respective base electrodes 15 and 19 are of opposite polarity so that as one of the quasi-complementary output transistors conducts more current, the other one is driven to conduct less current. For very large signals, the output transistors 16 and 18 are driven alternately into saturation and cutoff, thus permitting the application of an output signal across the load resistance 20 having a peak-to-peak amplitude equal to the applied D.C. voltage from the terminal 22. At the same time the connection of the primary winding 31 between the collector electrode of the driving transistor 14 and the load resistor 20 permits the load to be driven directly by the driving transistor 14 for very low signal levels. In addition the signals which are applied to the respective base electrodes 15 and 19 of the output transistors 16 and 18 are dependent upon the current which flows through the windings of the transformer 30, in particular through the primary winding 31. The 1:1 ratio between primary and secondary windings permits the use of a bifilar wound transformer for the transformer 30 which presents a very desirable frequency response characteristic by virtue of its very good coupling between windings with substantially no leakage inductance. It will be further noted that the resistor 34 carries a major portion of the collector current from the driving transistor 14 so that the transformer 30 is driven at a relatively low level of current. This permits the core material of the transformer 30 to be operated over a linear portion of its magnetization curve so that phase shift distortion which might otherwise arise from core saturation effects is substantially non-existent.

Degenerative feedback is effected in the circuit of the amplifier 10 by virtue of the connection via the resistor 38 and the capacitor 40 between the output terminal 35 and the emitter electrode of the input transistor 12. It will be noted that this path constitutes the D.C. direct current path of the transistor 12, thus advantageously achieving a gain stabilization with the circuit of the amplifier 10 at all frequencies from D.C. to the upper limit of the range which the amplifier 10 is intended to handle.

The above-described circuit arrangement in accordance with the invention provides a particularly simple and reliable amplifier circuit which achieves the desired signal amplification with a minimum of circuitry and with a freedom from distortion and from undesirable ambient temperature variations which has not hitherto been so provided. Although one particular arrangement of a Class B amplifier has been shown and described in order to demonstrate an exemplary embodiment of the invention, it will be understood that the invention is not limited thereto. Accordingly any and all modifications, variations or equivalent arrangements falling within the scope of the annexed claims should be considered to be a part of the invention.

What is claimed is:

1. An electrical signal amplifying circuit comprising: a pair of output devices each having output electrodes arranged in a quasi-complementary configuration so that the respective devices amplify input signals of opposite polarity respectively, means connecting selected output electrodes of said devices together in a common output connection, a load connected to said common output connection, each of said devices having an input electrode and a third electrode, a transformer having primary and secondary windings, means connecting the primary winding of said transformer directly between the input electrode of a first one of said devices and the common output connection to provide a path therebetween having a resistance equal to that of said primary winding, means connecting the secondary winding of said transformer directly between the input electrode and third electrode of the second of said devices to provide a current path therebetween having a resistance equal to that of said secondary winding, bias means coupled between said third electrodes of said first and second ones of said output devices, and means directly coupled by purely resistive circuit paths to the input electrode of said first device and to said primary winding for applying information signals thereto in order to control both of said devices.

2. An electrical signal amplifying circuit according to claim 1, further defined by said primary and secondary windings of said transformer being in a bifilar winding arrangement and having a 1:1 turns ratio.

3. An electrical signal amplifying circuit comprising: a plurality of transistors as amplifying devices, each of said transistors having input and output electrodes, a first and a second transistor being connected in a quasi-complementary circuit configuration as an output amplifier, said first and second transistors having a pair of electrodes connected together in a common connection, a load resistance coupled to said common connection, means connecting the output electrode of a third transistor to the input electrode of said first transistor, a transformer having primary and secondary windings for coupling the output electrode of the third transistor to the input electrode of the second transistor, means for providing a current path between the output electrode of the third transistor and the load resistance, a fourth one of said transistors having its output terminal connected directly to the input electrode of the third transistor, and a negative feedback path connected between the input electrode of said fourth transistor and the common connection of said first and second transistors.

4. An electrical signal amplifying circuit comprising first and second transistors connected as output devices in a quasi-complementary circuit configuration having a common output terminal, said transistors each having base, emitter, and collector electrodes, said emitter of said first transistor connected to said collector of said second transistor to define said common output terminal, a transformer having primary and secondary windings, said primary winding directly connected between said base and emitter of said first transistor, and defining a current path therebetween having a resistance equal to that of said primary winding, said secondary winding directly connected between said base and emitter of said second transistor and defining a current path therebetween having a resistance equal to that of said secondary winding, a load coupled between said common output terminal and said collector of said first transistor, a signal source, a purely resistive circuit path connecting said signal source to the connection between said base of said first transistor and said primary winding, and bias means coupled between said collector of said first transistor and said emitter of said second transistor.

5. An electrical signal amplifying circuit according to claim 4, further defined by a resistive current path connected between said base of said first transistor and said load at the opposite end thereof from that connected to said collector of said first transistor.

References Cited by the Examiner

UNITED STATES PATENTS

| | | | |
|---|---|---|---|
| 2,784,262 | 3/57 | Crow | 330—14 |
| 3,054,066 | 9/62 | Crane | 330—14 |

FOREIGN PATENTS

| | | |
|---|---|---|
| 1,238,817 | 7/60 | France. |
| 120,954 | 2/48 | Sweden. |

OTHER REFERENCES

Herscher: Designing Transistor A–F Power Amplifiers, Electronics, April 11, 1958, pages 96–99, Figure 2.

ROY LAKE, *Primary Examiner.*

NATHAN KAUFMAN, *Examiner.*